(12) United States Patent
Nam et al.

(10) Patent No.: US 12,413,090 B2
(45) Date of Patent: Sep. 9, 2025

(54) APPARATUS, METHOD AND COMPUTER PROGRAM FOR UPDATING CURRENT PATTERN FOR QUICK CHARGE

(71) Applicant: LG ENERGY SOLUTION, LTD., Seoul (KR)

(72) Inventors: Gi Min Nam, Daejeon (KR); Song Taek Oh, Daejeon (KR); Won Tae Joe, Daejeon (KR); Eun Seong Im, Daejeon (KR); Jae Min Jung, Daejeon (KR); Ko Woon Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 700 days.

(21) Appl. No.: 17/771,624

(22) PCT Filed: Jul. 1, 2020

(86) PCT No.: PCT/KR2020/008568
§ 371 (c)(1),
(2) Date: Apr. 25, 2022

(87) PCT Pub. No.: WO2021/125475
PCT Pub. Date: Jun. 24, 2021

(65) Prior Publication Data
US 2023/0022874 A1    Jan. 26, 2023

(30) Foreign Application Priority Data
Dec. 19, 2019  (KR) .......... 10-2019-0171205

(51) Int. Cl.
*H02J 7/00*      (2006.01)
*G01R 31/3842*   (2019.01)
*G01R 31/389*    (2019.01)

(52) U.S. Cl.
CPC .... *H02J 7/007182* (2020.01); *G01R 31/3842* (2019.01); *G01R 31/389* (2019.01); *H02J 7/0048* (2020.01)

(58) Field of Classification Search
None
See application file for complete search history.

(56) References Cited

U.S. PATENT DOCUMENTS 6,304,061 B1  10/2001  Toya
6,377,030 B1   4/2002  Asao et al.
(Continued)

FOREIGN PATENT DOCUMENTS

CN  101425698 A  5/2009
CN  104681889 A  6/2015
(Continued)

OTHER PUBLICATIONS

Extended European Search Report for European Application No. 20902599.8, dated Nov. 15, 2022.
(Continued)

*Primary Examiner* — Arun C Williams
(74) *Attorney, Agent, or Firm* — Birch, Stewart, Kolasch & Birch, LLP

(57) ABSTRACT

Disclosed is an apparatus and method for updating a current pattern for rapid charging, and a computer program stored in a storage medium performing the method, the apparatus includes a resistance calculation unit for calculating an internal resistance of a battery module, a storage unit for storing a current pattern for rapid charging of the battery module, and a calculation unit for updating the current pattern according to a state of the internal resistance of the battery module, and the calculation unit calculates a resistance increase rate based on the calculated internal resistance, calculates an adjustment coefficient based on the
(Continued)

calculated resistance increase rate, and updates the current pattern using the calculated adjustment coefficient and the current pattern so that when performing rapid charging, an impact on the battery module life is minimized.

18 Claims, 21 Drawing Sheets

(56) References Cited

U.S. PATENT DOCUMENTS

| | | | | |
|---|---|---|---|---|
| 2004/0135581 | A1* | 7/2004 | Blessing | G01R 31/389 324/426 |
| 2006/0001429 | A1* | 1/2006 | Huang | G01R 31/389 324/426 |
| 2008/0054848 | A1* | 3/2008 | Yun | G01R 31/389 320/134 |
| 2008/0169819 | A1* | 7/2008 | Ishii | G01R 31/389 324/430 |
| 2009/0112496 | A1 | 4/2009 | Suzuki | |
| 2009/0295399 | A1* | 12/2009 | Ueda | B60L 58/14 307/10.7 |
| 2012/0119745 | A1* | 5/2012 | Deveau | G01R 31/396 324/429 |
| 2013/0138373 | A1* | 5/2013 | Lee | G01R 31/3832 702/65 |
| 2013/0325379 | A1* | 12/2013 | Nakamura | G01R 31/3835 702/63 |
| 2013/0335034 | A1 | 12/2013 | Suzuki et al. | |
| 2014/0177145 | A1 | 6/2014 | Kawahara et al. | |
| 2015/0002104 | A1* | 1/2015 | Moell | G01R 21/133 361/93.7 |
| 2015/0051854 | A1 | 2/2015 | Joe et al. | |
| 2015/0355288 | A1* | 12/2015 | Yokoyama | G01R 31/389 702/63 |
| 2015/0369867 | A1 | 12/2015 | Kanada | |
| 2016/0028255 | A1 | 1/2016 | Nishikawa et al. | |
| 2017/0141444 | A1 | 5/2017 | Kawahara et al. | |
| 2017/0207497 | A1 | 7/2017 | Chae et al. | |
| 2018/0076633 | A1 | 3/2018 | Fujita et al. | |
| 2018/0228824 | A1 | 8/2018 | Sakabe et al. | |
| 2018/0246174 | A1* | 8/2018 | Shimosawa | G01R 31/389 |
| 2018/0372800 | A1 | 12/2018 | Kanada | |
| 2019/0341784 | A1 | 11/2019 | Lee et al. | |
| 2020/0271727 | A1 | 8/2020 | Bae et al. | |
| 2020/0280204 | A1 | 9/2020 | Sakabe et al. | |

FOREIGN PATENT DOCUMENTS

| | | |
|---|---|---|
| CN | 106505695 A | 3/2017 |
| EP | 2 669 695 A2 | 12/2013 |
| EP | 3 002 597 A1 | 4/2016 |
| JP | 2000-228832 A | 8/2000 |
| JP | 3676134 B2 | 7/2005 |
| JP | 3740323 B2 | 2/2006 |
| JP | 2008-199723 A | 8/2008 |
| JP | 2015-178821 A | 10/2015 |
| JP | 2016-23967 A | 2/2016 |
| JP | 5849897 B2 | 2/2016 |
| JP | 2017-17907 A | 1/2017 |
| JP | 6128066 B2 | 5/2017 |
| JP | 6245480 B2 | 12/2017 |
| JP | 6370740 B2 | 8/2018 |
| JP | 2014-119265 | 10/2018 |
| JP | 2018-186101 A | 11/2018 |
| JP | 2019-195252 A | 11/2019 |
| KR | 10-1387429 B1 | 4/2014 |
| KR | 10-1454833 B1 | 10/2014 |
| KR | 10-1531636 B1 | 6/2015 |
| KR | 10-2017-0086876 A | 7/2017 |
| KR | 10-2017-0086592 A | 8/2018 |
| KR | 10-2019-0100683 A | 8/2019 |
| WO | WO 2012/127775 A1 | 9/2012 |
| WO | WO 2014/148018 A1 | 9/2014 |
| WO | WO 2018/198058 A1 | 10/2019 |

OTHER PUBLICATIONS

Jiang et al., "An Optimal Charging Method for Li-Ion Batteries Using a Fuzzy-Control Approach Based on Polarization Properties", Transactions on Vehicular Technology, IEEE, vol. 62, No. 7, Sep. 1, 2013, pp. 3000-3009.

International Search Report (PCT/ISA/210) issued in PCT/KR2020/008568, dated Oct. 8, 2020.

Extended European Search Report for European Application No. 25151111.9, dated Apr. 24, 2025.

* cited by examiner (a)        (b)

APPARATUS, METHOD AND COMPUTER PROGRAM FOR UPDATING CURRENT PATTERN FOR QUICK CHARGE

MUTUAL CITATIONS WITH RELATED APPLICATIONS

The present invention claims the benefit of priority based on Korean Patent Application No. 10-2019-0171205 filed on Dec. 19, 2019, and includes all contents disclosed in the literature of the Korean patent application as part of this specification.

TECHNICAL FIELD

The present invention relates to an apparatus and method for updating a current pattern for rapid charging, and a computer program stored in a storage medium performing the method.

BACKGROUND ART

Recently, with the spread of electronic devices such as smartphones and the development of electric vehicles, research on secondary batteries as a power source has also been actively conducted. The secondary battery is provided in the form of a battery pack including a battery module in which a plurality of battery cells are connected in series and/or in parallel, and a battery management system (BMS) that manages the operation of the battery module.

The battery pack performs rapid charging based on a current pattern for rapid charging, if necessary, but there is a fear that the capacity of the battery pack rapidly decreases as the number of rapid charging increases.

DISCLOSURE

Technical Problem

The present invention has been made in consideration of such a situation, and has an object to provide a rapid charging current pattern updating device and method for efficiently performing rapid charging of a battery pack and not affecting the life of the battery pack, and a computer program stored in a storage medium performing the method.

Technical Solution

To solve the above technical problem, according to one aspect of embodiments of the present invention, an apparatus for updating a current pattern for rapid charging includes: a resistance calculation unit configured to calculate an internal resistance of a battery module; a storage unit configured to store a current pattern for rapid charging of the battery module; and a calculation unit configured to update the current pattern according to a state of the internal resistance of the battery module, wherein the calculation unit calculates a resistance increase rate based on the internal resistance calculated by the resistance calculation unit, calculates an adjustment coefficient based on the calculated resistance increase rate, and updates the current pattern using the calculated adjustment coefficient and the current pattern for charging the battery module.

To solve the above technical problem, according to another aspect of embodiments of the present invention, a method of updating a current pattern for rapid charging includes: setting a current pattern for rapid charging of a battery module; calculating an internal resistance of the battery module; calculating a resistance increase rate of the battery module; calculating an adjustment coefficient based on the resistance increase rate; adjusting the current pattern using the adjustment coefficient to generate an adjustment current pattern; and charging the battery module based on the adjusted current pattern.

To solve the above technical problem, according to another aspect of embodiments of the present invention, a computer program stored in a computer-readable storage medium and allowing a computer to execute the method of updating a current pattern for rapid charging of the battery module.

Advantageous Effects

According to the above-described current pattern updating device and method for rapid charging, and a computer program stored in a storage medium performing the method, it is possible to minimize the effect on the life of the battery module when performing rapid charging.

Figure 4:
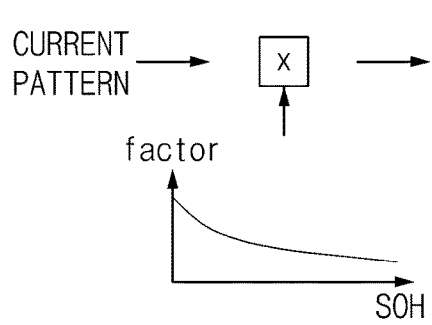
Figure 4:
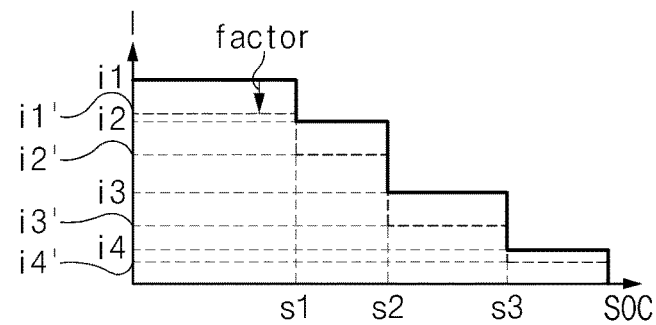

(a) and (b) of FIG. 4 are views schematically showing a method of updating a current pattern for rapid charging according to an embodiment of the present invention.

Figure 5:
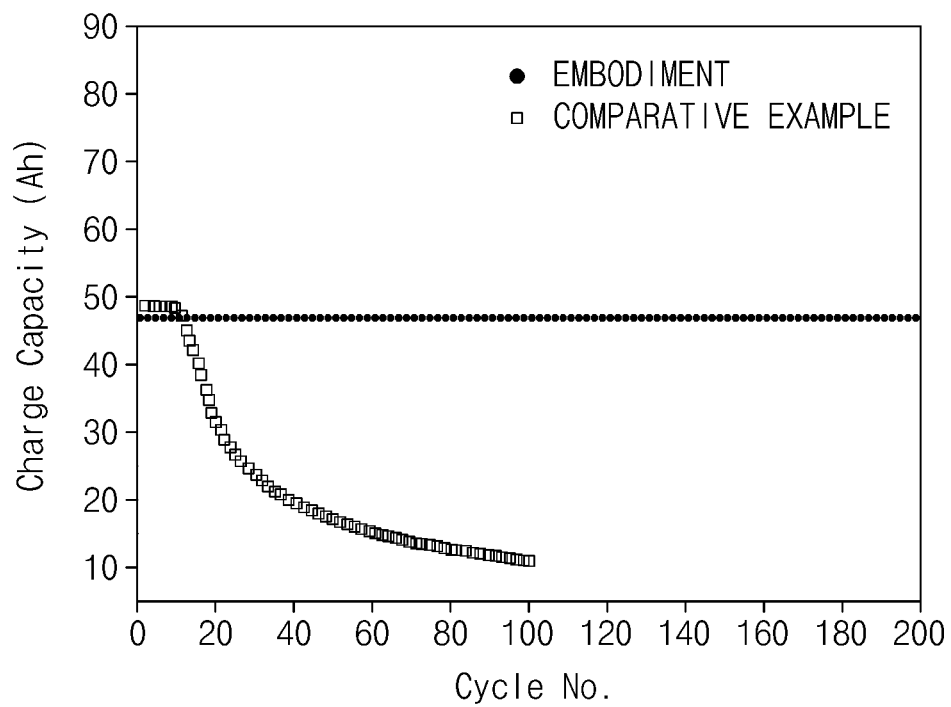

FIG. 5 is test data showing a change in capacity of a battery module when updating the current pattern for rapid charging according to an embodiment of the present invention.

Figure 6:
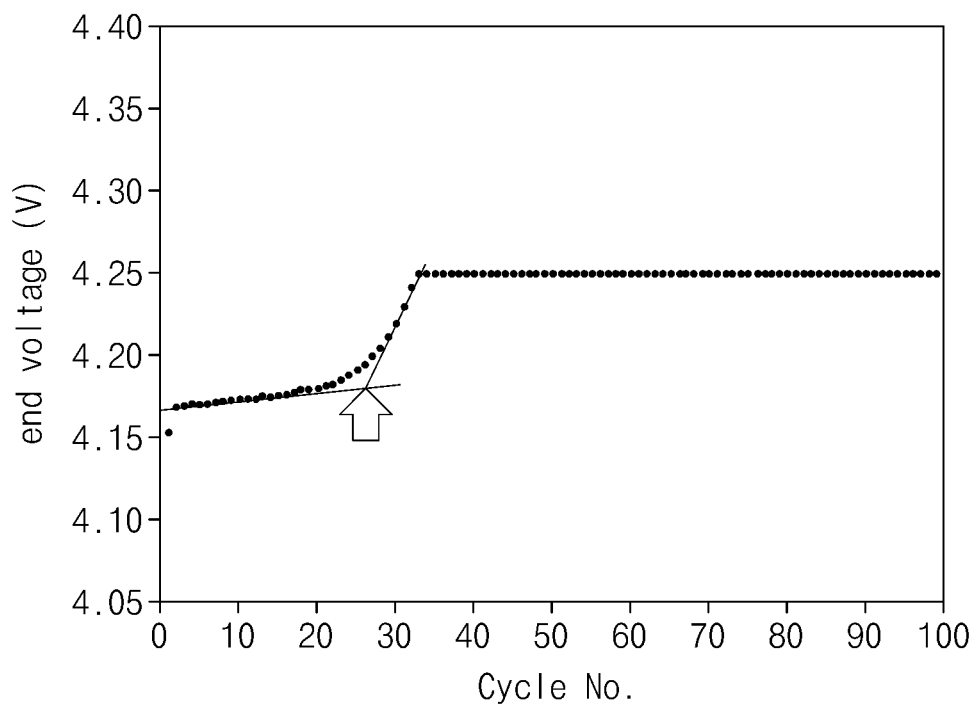

FIG. 6 is a graph showing an update timing of a current pattern for rapid charging according to an embodiment of the present invention.

Figure 7:
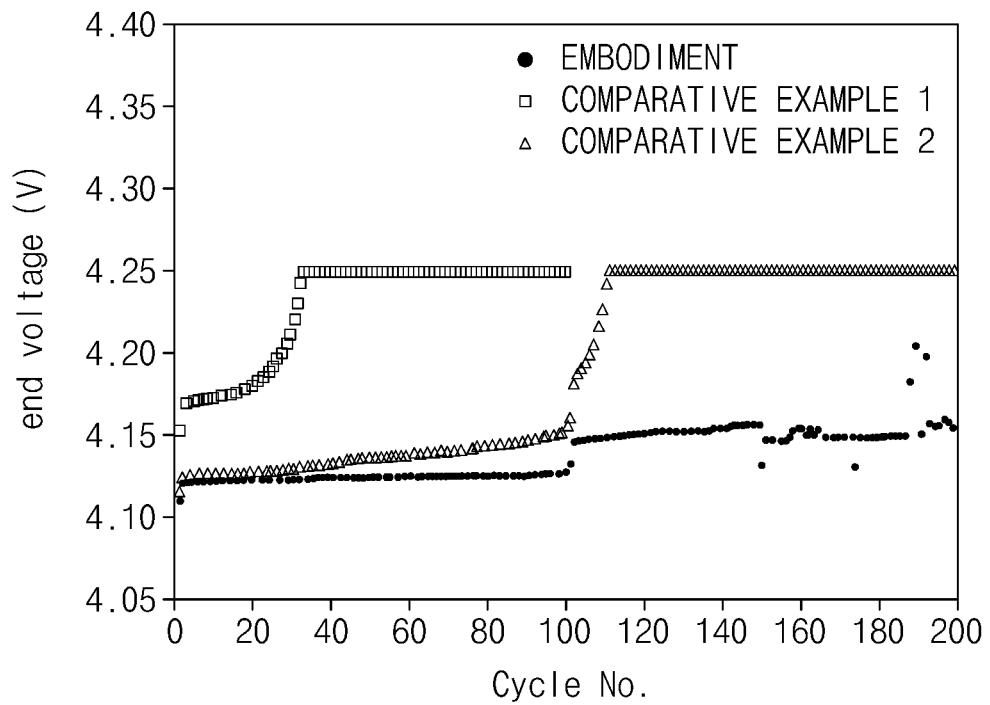

FIG. 7 is test data showing a change in capacity of a battery module when a current pattern is updated according to an update timing of a current pattern for rapid charging according to an embodiment of the present invention.

Figure 8:
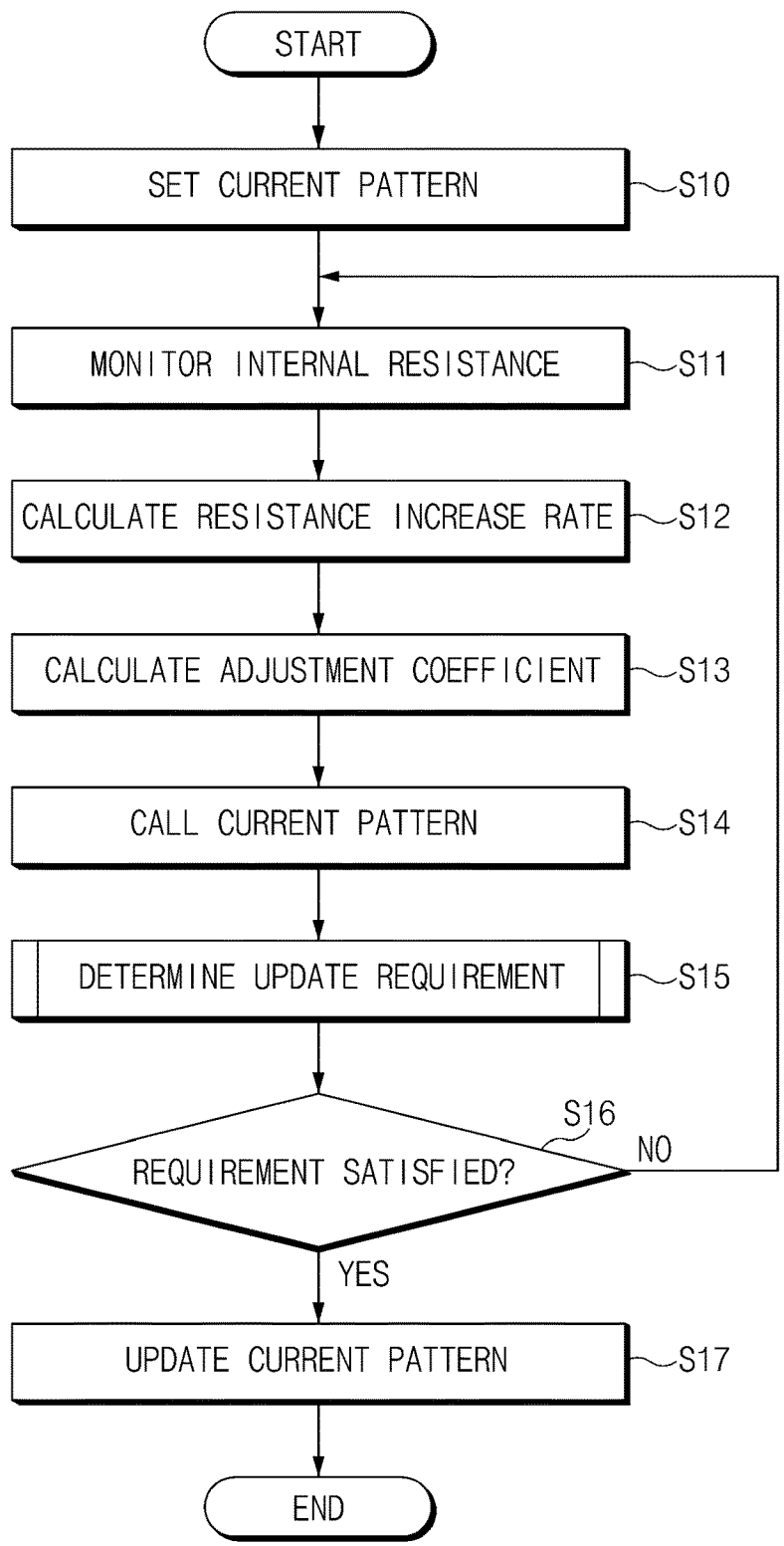

FIG. 8 is a flowchart illustrating a method of updating a current pattern for rapid charging according to an embodiment of the present invention.

Figure 9:
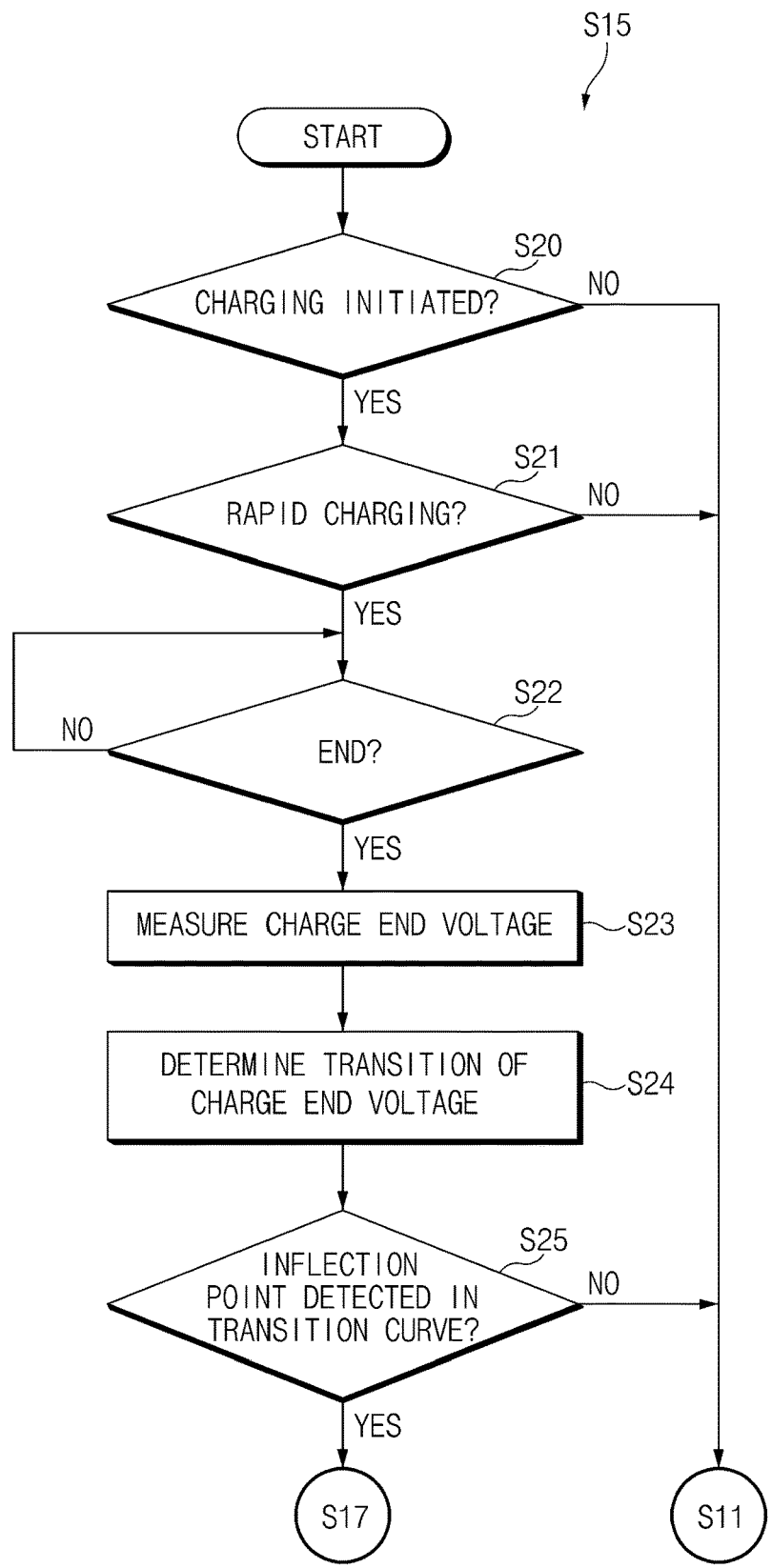

FIG. 9 is a flowchart illustrating a method for determining an update timing of a current pattern for rapid charging according to an embodiment of the present invention.

Figure 10:
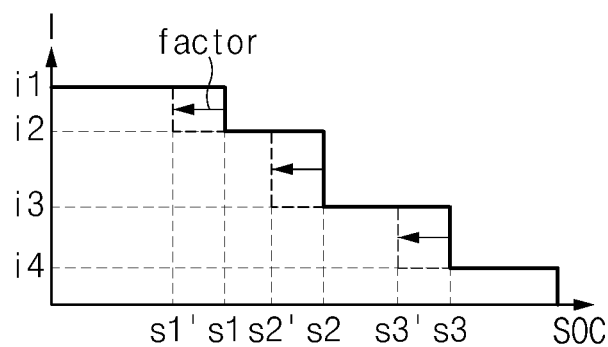

FIG. 10 is a view showing a modification of the method of updating the current pattern for rapid charging according to the embodiment of FIG. 4.

Figure 11:
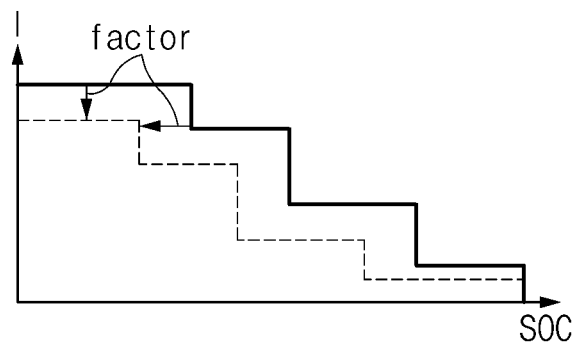

FIG. 11 is a view showing another modification of the method of updating the current pattern for rapid charging according to the embodiment of FIG. 4.

Figure 12:
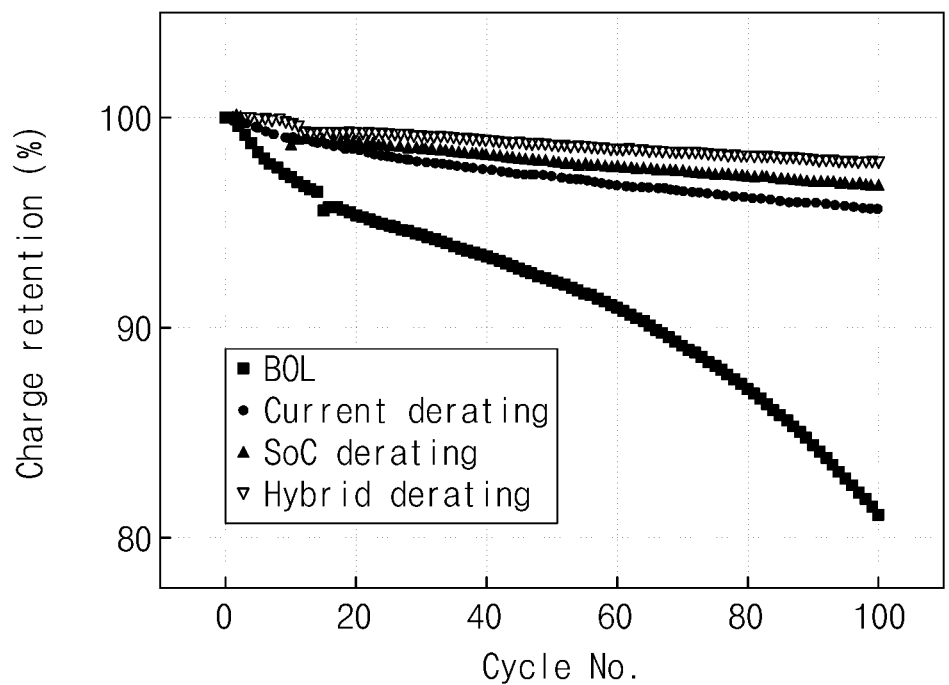

FIG. 12 is experimental data for measuring a change in capacity of a battery module using the current pattern update method for rapid charging of FIGS. 4, 10, and 11.

Figure 13:
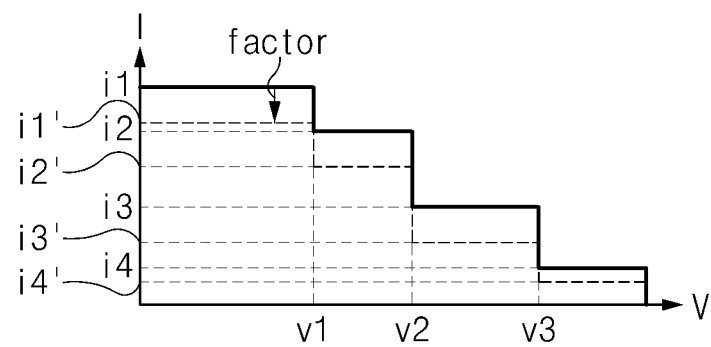

FIG. 13 is a view showing a method of updating a current pattern for rapid charging according to another embodiment of the present invention.

Figure 14:
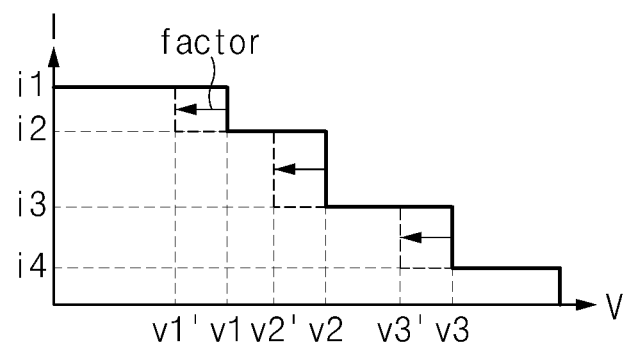

FIG. 14 is a view showing a modification of the method of updating the current pattern for rapid charging according to the embodiment of FIG. 13.

Figure 15:
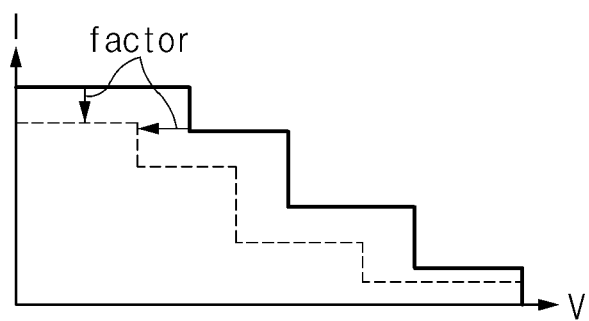

FIG. 15 is a view showing another modification of the method of updating the current pattern for rapid charging according to the embodiment of FIG. 13.

Figure 16:
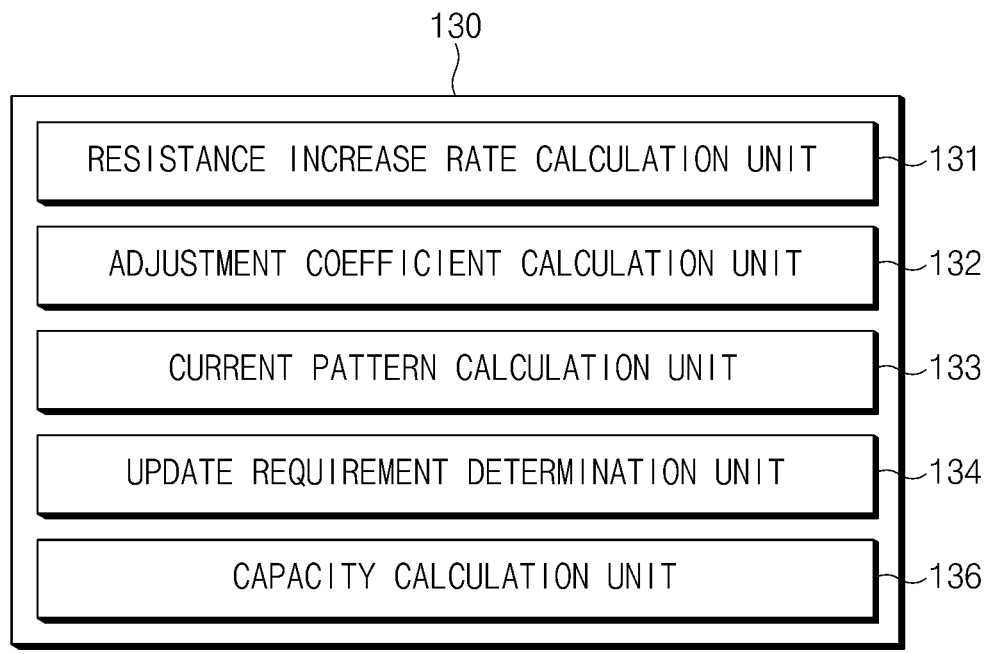

FIG. 16 is a block diagram showing detailed functions of a calculation unit according to another embodiment of the present invention.

Figure 17:
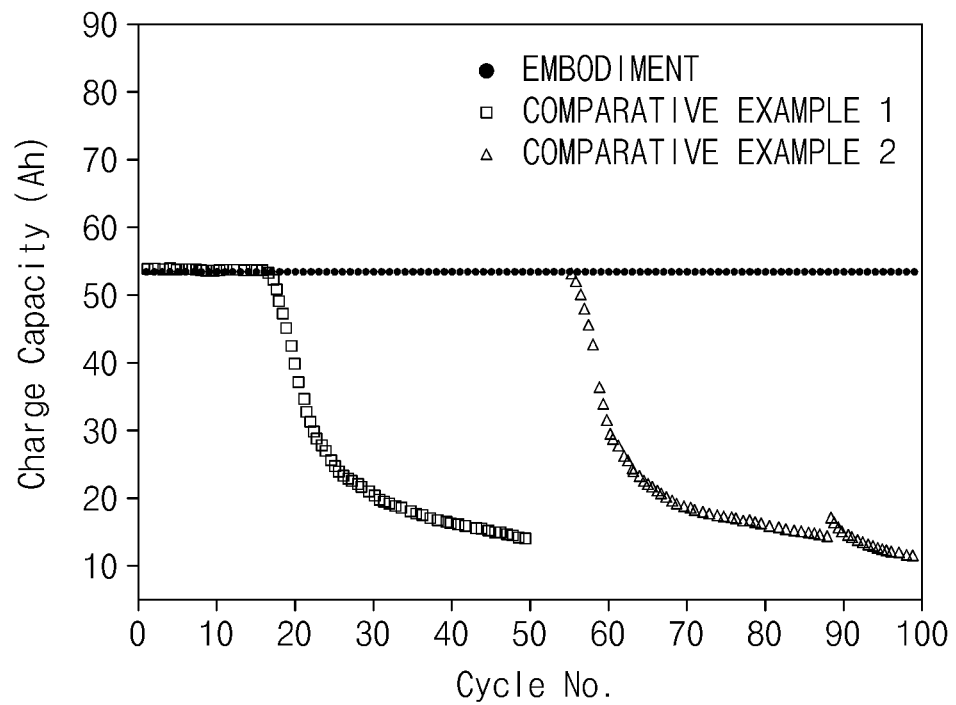

FIG. 17 is test data showing a change in capacity of a battery module when updating a current pattern for rapid charging according to another embodiment of the present invention.

Figure 18:
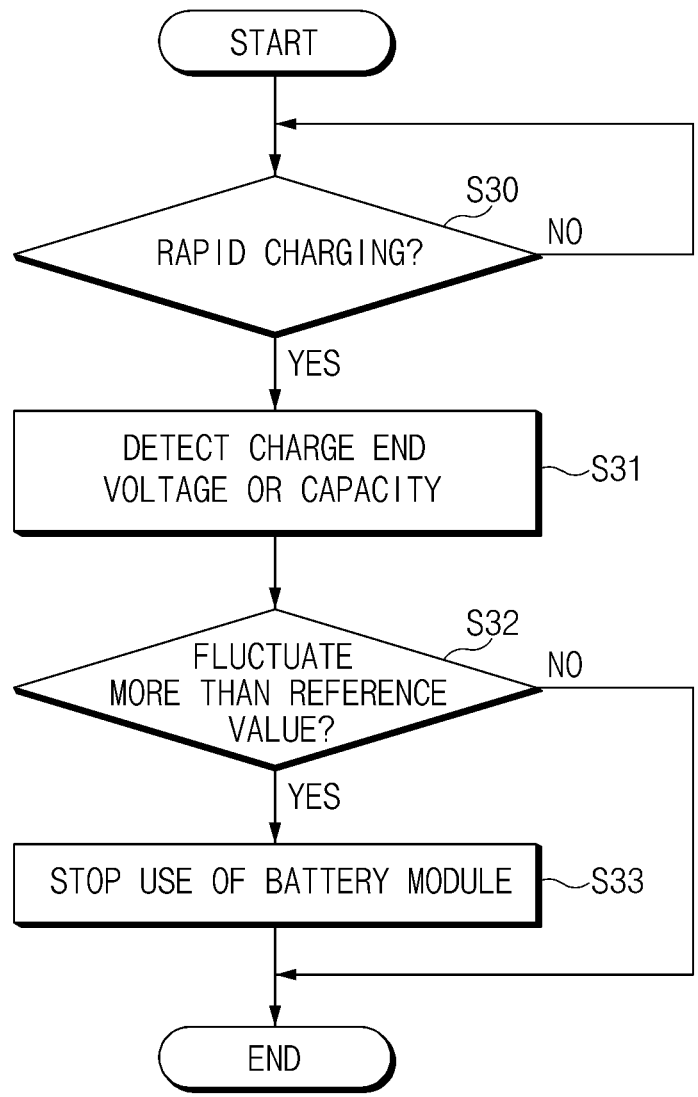

FIG. 18 is a flowchart illustrating a method of determining a time point of stopping the use of a battery module according to an embodiment of the present invention.

Figure 19:
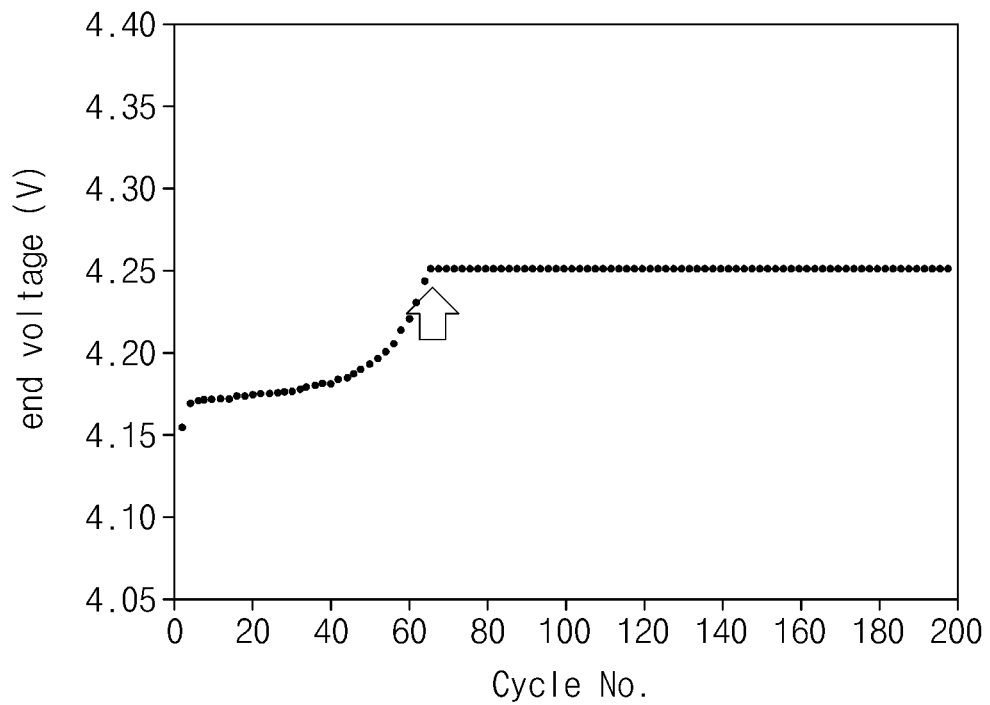

FIG. 19 is a graph of end voltage vs. cycle number for explaining a time point of stopping the use of a battery module according to an embodiment of the present invention.

Figure 20:
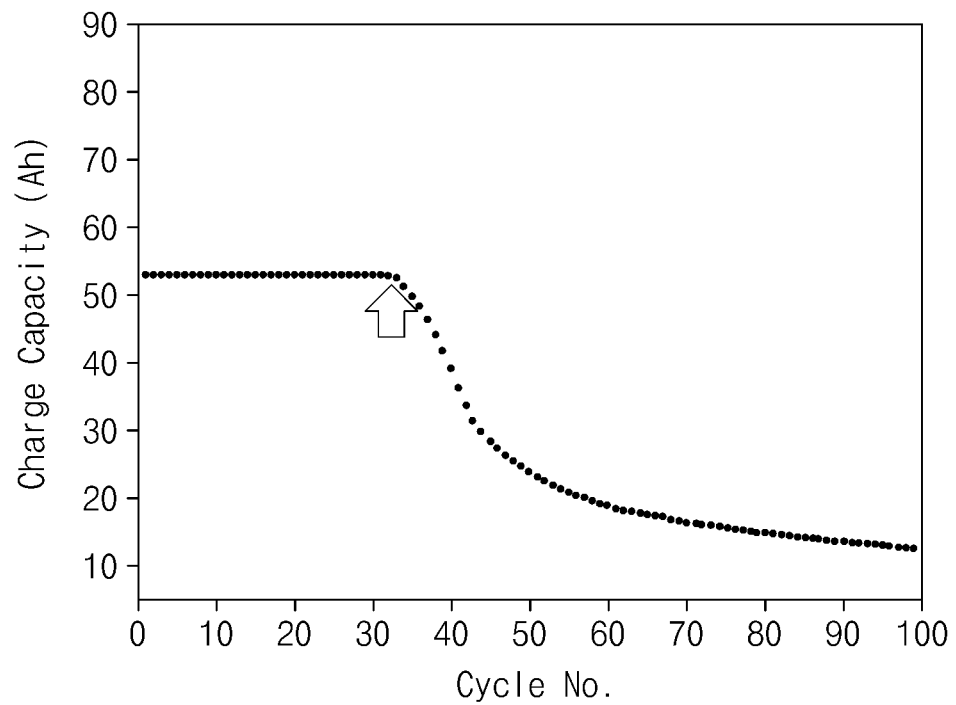

FIG. 20 is a graph of charge capacity vs. cycle number for explaining a time point of stopping the use of a battery module according to an embodiment of the present invention.

Figure 21:
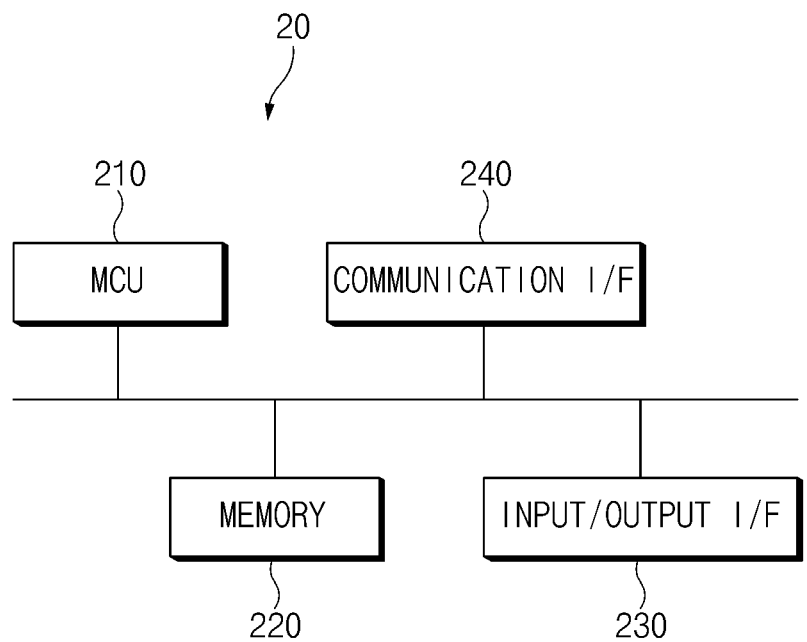

FIG. 21 is a hardware configuration diagram of a battery management system.

BEST MODE

Hereinafter, various embodiments of the present invention will be described in detail with reference to the accompanying drawings. In this document, the same reference numerals are used for the same components in the drawings, and duplicate descriptions for the same components are omitted.

For various embodiments of the present invention disclosed in this document, specific structural or functional descriptions are exemplified only for the purpose of explaining an embodiment of the present invention, and various embodiments of the present invention may be implemented in various forms and should not be construed as being limited to the embodiments described in this document.

The terms such as "1st", "2nd", "first", "second", and the like used herein may refer to modifying various different elements of various embodiments of the present disclosure, but do not limit the elements. For example, a first component may be referred to as a second component and vice versa without departing from the technical scope of the present invention.

Terms used herein is for the purpose of describing particular example embodiments only and is not intended to be limiting of the scope of other embodiments. The terms of a singular form may include plural forms unless they have a clearly different meaning in the context.

Figure 1:
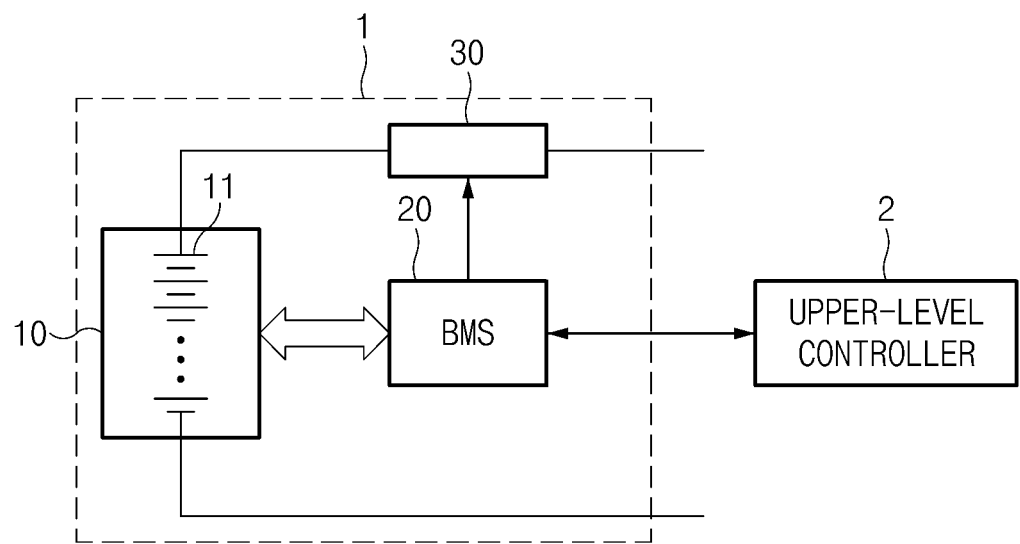
FIG. 1 is a view showing the configuration of a battery pack including a battery management system.

FIG. 1 is a view showing the configuration of a battery pack 1 including a battery management system 20.

Referring to FIG. 1, the battery pack 1 includes a battery module 10 composed of one or more battery cells and capable of being charged and discharged, a switching unit 30 connected in series to the positive (+) terminal side or the negative (−) terminal side of the battery module 10 to control the charge/discharge current flow of the battery module 10, and a battery management system 20 (hereinafter referred to as 'BMS') that monitors the voltage, current, temperature, and the like of the battery cell and/or the battery module 10 to control and manage the prevention of overcharge and overdischarge.

The battery module 10 includes one or more battery cells 11 that can be charged and discharged. The battery cell 11 may be a lithium ion (Li-ion) battery, a lithium ion polymer (Li-ion polymer) battery, a nickel cadmium (Ni—Cd) battery, a nickel hydrogen (Ni-MH) battery, and the like, but is not limited thereto.

The BMS 20 may control the operation of the switching unit 30 to control charging and discharging of the battery module 10. In addition, the BMS 20 may monitor the voltage, current, temperature, and the like of the battery module 10 and/or each battery cell 11 included in the battery module 10. In addition, for monitoring by the BMS 20, sensors or various measurement modules may be additionally installed at any location of the battery module 10, or the charge/discharge path, or the battery pack 1. The BMS 20 may calculate parameters indicating the state of the battery module 10, for example, the state of charge (SOC) or the state of health (SOH), based on the measurement values of the monitored voltage, current, and temperature.

The BMS 20 controls and manages the overall operation of the battery pack 1. For this, the BMS 20 may include various components, such as a microcomputer as a controller that executes a program and controls the overall operation of the BMS 20, input/output devices, such as sensors and measurement means, and other peripheral circuits.

In addition, the BMS 20 may perform rapid charging of the battery module 10 according to a preset algorithm. The preset algorithm may be to charge the battery module 10 according to a specific current pattern. In particular, the BMS 20 according to an embodiment of the present invention provides a method for updating the current pattern for rapid charging of the battery module 10 and a method for determining when to update. In addition, the BMS 20 according to an embodiment of the present invention also provides a method for determining when to stop using the battery module 10. Details of the functions of the BMS 20 will be described later.

The switching unit 30 is a semiconductor switching element for controlling the current flow for the charge or discharge of the battery module 10, and for example, at least one MOSFET may be used. It will be readily understood by those skilled in the art that a relay or a contactor may be used as the switching unit 30 in addition to the semiconductor switching element.

The battery pack 1 may be further communicatively connected to an external upper-level controller 2. That is, the battery pack 1 may transmit various data for the battery pack 1 to the upper-level controller 2 and receive control signals for the operation of the battery pack 1 from the upper-level controller 2. The upper-level controller 2 may be a vehicle controller for controlling the operation of the vehicle when the battery pack 1 is mounted in an electric vehicle. The upper-level controller 2 may be a rack BMS that manages a plurality of battery modules or a BMS that controls the overall operation of an energy storage device (ESS) when the battery pack 1 is used in the ESS.

Figure 2:
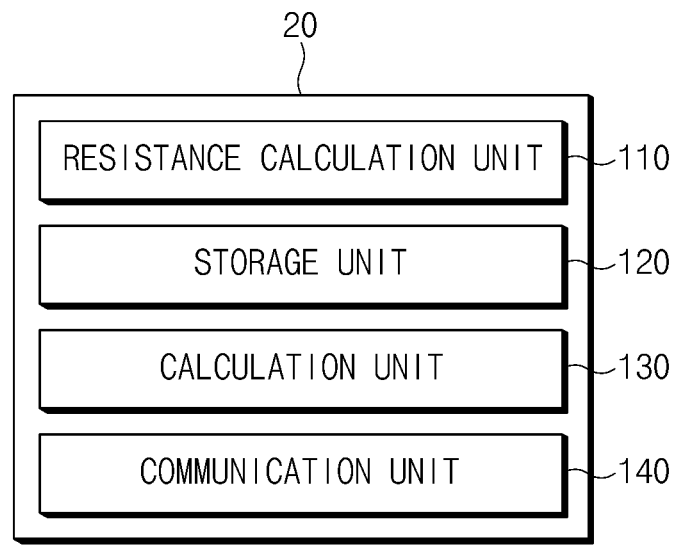
FIG. 2 is a block diagram showing functions of a battery management system according to an embodiment of the present invention.

FIG. 2 is a block diagram showing functions of a BMS 20 according to an embodiment of the present invention.

Referring to FIG. 2, the BMS 20 may include a resistance calculation unit 110, a storage unit 120, a calculation unit 130, and a communication unit 140.

The resistance calculation unit 110 calculates the internal resistance of the battery module 10. The resistance calculation unit 110 may indicate a set of various sensors for calculating the internal resistance of the battery module 10. For example, the resistance calculation unit 110 may include at least one of a voltage measurement means for measuring the OCV of the battery module 10, a current measurement means for measuring the current charged and discharged in the battery module 10, and a temperature measurement means for measuring the temperature of the battery module 10. The resistance calculation unit 110 may include a calculation means for calculating the internal resistance value of the battery module 10 from values measured by each measurement means in addition to the various measurement means described above.

The storage unit 120 may store various programs and data necessary for the operation of the BMS 20. The storage unit 120 may store an algorithm for rapidly charging the battery module 10 as described above. In addition, the storage unit 20 may store a current pattern for rapid charging for the battery module 10 for use during rapid charging. The algorithm for rapid charging may include a method for updating a current pattern for rapid charging and information on when to update.

The calculation unit 130 updates the current pattern according to the state of the internal resistance of the battery module 10. The detailed operation of the calculation unit 130 will be described later with reference to FIG. 3.

The communication unit 140 may transmit various information on the battery cell(s) 11, the battery module 10 and/or the battery pack 1 to the upper-level controller as necessary. Also, the communication unit 140 may receive a control signal for controlling the battery pack 1 from the upper-level controller 2. If it is determined that the communication module 140 should stop using the battery module 10, it may transmit the message to the upper-level controller 2.

Figure 3:
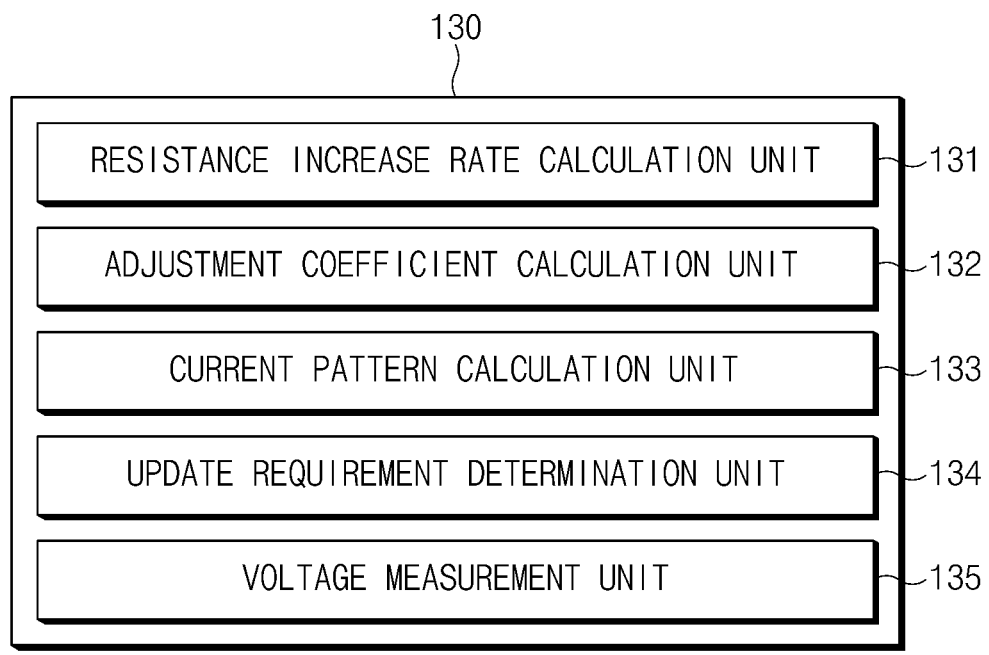
FIG. 3 is a block diagram showing detailed functions of a calculation unit according to an embodiment of the present invention.

FIG. 3 is a block diagram showing detailed functions of a calculation unit 130 according to an embodiment of the present invention.

Referring to FIG. 3, the calculation unit 130 includes a resistance increase rate calculation unit 131, an adjustment coefficient calculation unit 132, a current pattern calculation unit 133, an update requirement determination unit 134, and a voltage measurement unit 135.

The resistance increase rate calculation unit 131 calculates a resistance increase rate based on the internal resistance calculated by the resistance calculation unit 110. The resistance increase rate can be calculated as follows.

$$\text{resistance increase rate (\%)} = (\text{degeneration resistance}/\text{initial resistance} - 1) * 100 \quad \text{[Equation 1]}$$

The resistance increase rate calculation unit 131 may calculate the rate at which the internal resistance of the battery module 10 changes for a predetermined period. The predetermined period may be any period periodically set. Alternatively, the resistance increase rate calculation unit 131 may calculate a resistance increase rate based on the internal resistance measured immediately before the rapid charging is performed and the previously measured internal resistance. However, the contents of the time point and the period for calculating the internal resistance are only examples and are not limited thereto.

The adjustment coefficient calculation unit 132 calculates an adjustment coefficient based on the resistance increase rate calculated by the resistance increase rate calculation unit 131. The adjustment coefficient calculation unit 132 calculates an adjustment coefficient to decrease the adjustment coefficient as the resistance increase rate increases.

As an example, the resistance increase rate calculation unit 131 may calculate an adjustment coefficient by Equation 2 below.

$$\text{adjustment coefficient} = (100 - \alpha*(\text{resistance increase rate (\%)}))/100 \quad \text{[Equation 2]}$$

In this case, the α value may be a value determined according to the type of the battery module 10. That is, the α value may be a value determined according to the chemical components constituting the battery cell, such as whether the battery module 10 is a lithium ion battery or a lithium ion polymer battery. This α value may have a value between 0.5 and 4.

As another example, the resistance increase rate calculation unit 132 may calculate an adjustment coefficient by Equation 3 below.

$$\text{adjustment coefficient} = 1/(\alpha*(1 + \text{resistance increase rate (\%)}/100)) \quad \text{[Equation 3]}$$

The α value at this time is also the same value as the α value in Equation 2.

That is, the resistance increase rate calculation unit 132 calculates an adjustment coefficient to reduce the current pattern. In other words, the algorithm for updating the current pattern for rapid charging according to embodiments of the present invention is to reduce the current magnitude of the current pattern.

The current pattern calculation unit 133 uses the calculated adjustment coefficient and the current pattern stored in the storage unit 120 to update the current pattern. Specifically, the current pattern calculation unit 133 calculates a value obtained by multiplying a previously stored current pattern by an adjustment coefficient calculated by the adjustment coefficient calculation unit 132 as a new current pattern for rapid charging in order for updating.

FIG. 4 is a diagram schematically showing a method of updating a current pattern for rapid charging according to an embodiment. As described above, it is shown that a new current pattern (b) is calculated by multiplying an existing current pattern for rapid charging by an adjustment coefficient (a). In the case of FIG. 4, when charging is performed in a capacity-restricted manner, the current gradually decreases depending on the state of charge (SOC) of the battery module 10. As shown in FIG. 4, the current pattern is set to charge the current magnitude with it until SOC becomes s1, with i2 in the section from s1 to s2, with i3 in the section s3, and with i4 from s3 to full charge. And the current pattern is changed as a dotted line by multiplying the adjustment coefficient by the time point at which the current pattern for rapid charging needs to be updated. The currents are changed to i1', i2', i3' and i4', respectively. Here, i1'=i1* (adjustment coefficient), i2'=i2*(adjustment coefficient), i3'=i3*(adjustment coefficient), and i4'=i4*(adjustment coefficient). That is, an existing current pattern is updated with a current pattern having a new magnitude generated by multiplying the magnitude of the current in the current pattern by an adjustment coefficient (current derating type update).

The update requirement determination unit 134 determines when to update the current pattern for rapid charging. In the present embodiment, as described in FIG. 4, the current pattern for rapid charging is applied with a capacity limiting method that performs charging until the battery module 10 reaches a preset charging capacity. In this case, the update requirement determination unit 134 determines that it is time to update the current pattern when the transition curve of the charge end voltage, which is the voltage upon completion of charging of the rapid charging, satisfies a preset criterion. The preset criterion for the transition curve of the charge end voltage may be that an inflection point is generated in the transition curve of the charge end voltage. The inflection point may be a signal indicating that an abnormality is occurring in the battery cell 11. Therefore, by monitoring the occurrence of this inflection point, it is possible to identify the update time point of the current pattern for rapid charging.

When it is determined by the update requirement determination unit 134 that the current pattern needs to be updated, the current pattern for rapid charging is updated with the new current pattern calculated by the current pattern calculation unit 133. In this case, the updated current pattern may be stored in the storage unit 120.

The voltage measurement unit 135 measures the charge end voltage, which is the voltage at the completion of the rapid charging whenever the battery module 10 is rapidly charged. The voltage measurement unit 135 may be a voltage sensor that monitors the voltage of the battery cell 11 and/or the battery module 10. In addition, the voltage measurement unit 135 may derive the charge end voltage in a manner that monitors the voltage of the battery module 10 in real time and uses a voltage at a time point required when determining an update requirement.

In this embodiment, the update requirement is determined using the charge end voltage, but this is exemplary and is not limited thereto. For example, if the parameter is correlated with the characteristics of the charge end voltage, the parameter may be used as a factor for determining the update requirement. For example, an update requirement may be determined using a resistance value calculated using a charge end voltage and an OCV value.

FIG. 5 is test data showing a change in capacity of the battery module 10 when updating the current pattern for rapid charging according to an embodiment of the present invention.

As can be seen in the 'comparative example' graph in FIG. 5, when rapidly charging the battery module 10 without changing the current pattern for rapid charging, it may be checked that the capacity of the battery module 10 rapidly decreases. Specifically, when the rapid charging was repeated about 10 times, the capacity of the battery module 10 rapidly decreased.

On the other hand, as can be seen in the 'Embodiment' graph, when rapidly charging the battery module 10 by updating the current pattern for rapid charging according to the present invention, there was almost no change in the capacity of the battery module 10. That is, the capacity change of the battery module 10 according to the number of rapid charges was hardly found.

When the current pattern for rapid charging of the battery module 10 is continuously used without changing the previously stored current pattern, due to the change in the internal resistance of the battery module 10, it also affects the capacity of the battery module 10.

However, according to the method of updating the current pattern for rapid charging according to the embodiment of the present invention as described above, the current pattern also changes in consideration of the change in the internal resistance of the battery module 10.

Therefore, even if the battery module 10 is rapidly charged, the capacity change of the battery module 10 can be minimized.

FIG. 6 is a graph showing an update timing of a current pattern for rapid charging according to an embodiment of the present invention.

Referring to FIG. 6, the transition of the charge end voltage measured upon completion of the rapid charging is illustrated. The update requirement determination unit 134 detects an inflection point in the transition curve of the charge end voltage, as indicated by the arrow.

FIG. 7 is test data showing a change in capacity of a battery module when a current pattern is updated according to an update timing of a current pattern for rapid charging according to an embodiment of the present invention.

Referring to FIG. 7, the "Comparative Example 1" graph is a graph showing a change in the charge end voltage of the battery module 10 when the update algorithm of the current pattern for rapid charging is not applied at all. It was checked that the charge end voltage rapidly increased after about 20 times of rapid charging.

The 'Comparative Example 2' graph applies the update algorithm of the rapid charging current pattern, but the update time point is a graph applied when the inflection point is generated. Compared to Comparative Example 1, it was checked that the charge end voltage did not change even after a considerable number of rapid charging repetitions. However, after about 100 times of rapid charging, it was checked that the charge end voltage rapidly increased.

The 'Embodiment' graph is a graph in which the update algorithm of the current pattern for rapid charging is applied immediately after the inflection point occurs. As can be clearly seen in the graph, it was confirmed that the increase in the charge end voltage of the battery module 10 was significantly suppressed despite repeated rapid charging of 100 times or more.

When not updating the current pattern for rapid charging of the battery module 10 and also update timing is delayed even when updating, the capacity reduction of the battery module 10 cannot be avoided.

However, according to the method of determining the update timing of the current pattern for rapid charging according to the embodiment of the present invention as described above, it is possible to accurately and quickly identify the time point that needs to update the current pattern for rapid charging, so that it is possible to minimize the change in capacity of the battery module 10.

FIG. 8 is a flowchart illustrating a method of updating a current pattern for rapid charging according to an embodiment of the present invention.

Referring to FIG. 8, a current pattern for rapid charging is previously set in the storage unit 120 of the BMS 20 (S10). The current pattern can be set before shipment of the battery pack 1 by the manufacturer. Alternatively, even after the battery pack 1 is shipped, the current pattern for rapid charging may be set by the manufacturer or the user.

Thereafter, while the battery pack 1 is mounted and used in a vehicle or the like, the BMS 20 monitors the internal resistance of the battery module 10 (S11). In other words, the internal resistance of the battery module 10 is calculated. And the resistance increase rate of the internal resistance is calculated from the monitored internal resistance (S12). And, an adjustment coefficient is calculated based on the calculated resistance increase rate (S13). Since the calculation of the resistance increase rate and the calculation of the adjustment coefficient in operations S12 and S13 has been described in detail in FIGS. 2 and 3, a detailed description is omitted here.

The BMS 20 calls the current pattern for rapid charging stored in the storage unit 120 (S14), and determines whether the update requirement of the current pattern is satisfied (S15).

When the update requirement of the current pattern is satisfied (YES in S16), the current pattern is updated (S17). The update of the current pattern can be performed using the adjustment coefficient calculated in operation S13 and the current pattern called in operation S14. If the update requirement of the current pattern is not satisfied (NO in S16), the process returns to operation S11 again and the algorithm for updating the current pattern is repeatedly performed.

FIG. 9 is a flowchart illustrating a method for determining an update timing of a current pattern for rapid charging according to an embodiment of the present invention. FIG. 9 shows detailed operation S15 of FIG. 8.

Referring to FIG. 9, the BMS 20 determines whether the battery pack 1 starts charging (S20), and if it is determined that charging is started, determines whether the corresponding charging is rapid charging (S21). If charging is not started or the charging is not rapid charging, the algorithm according to the embodiments of the present invention is not applied, so the process proceeds to operation S11.

On the other hand, when the rapid charging is started (YES in S21), it waits until the rapid charging is finished. Then, when the rapid charge ending (S22), the charge end voltage of the battery module 10 is measured (S23). Then, the transition of the charge end voltage is determined from the repeatedly measured charge end voltage (S24).

When occurrence of the inflection point is detected in the transition curve of the charge end voltage as the update requirement of the current pattern for rapid charging (YES in S25), the process proceeds to step S17 to update the current pattern. On the other hand, if the inflection point is not detected in the transition curve of the charge end voltage (NO in S25), it is determined that rapid charging may be performed using an existing current pattern. Therefore, the process proceeds to operation S11. That is, operation S25 corresponds to operation S16 of FIG. 8.

The operation of measurement of the charge end voltage in operation S23 to operation S25, inflection point detection, and the like has been described in detail with reference to FIGS. 2 and 3, and thus detailed description thereof will be omitted.

FIG. 10 is a view showing a modification of the method of updating the current pattern for rapid charging according to the embodiment of FIG. 4. In FIG. 10, only a new current pattern obtained by multiplying a current pattern by an adjustment coefficient. In this example, charging is also performed in a capacity-limited manner, and the current is gradually reduced according to the SOC of the battery module 10.

However, in this example, the current pattern is changed as a dotted line by multiplying the value of SOC set as the time point for changing the magnitude of the current by an adjustment coefficient. In other words, the time point at which the current changes from i1 to i2 changes from s1 to s1', the time point at which the current changes from i2 to i3 changes from s2 to s2', and the time point at which the current changes from i3 to i4 changes from s3 to s3'. Here, s1'=s1*(adjustment coefficient), s2'=s2*(adjustment coefficient), and s3'=s3*(adjustment coefficient). That is, an existing current pattern is updated to a new SOC value obtained by multiplying the value of the SOC set as a time point to change the magnitude of the current in the current pattern by an adjustment coefficient as a current pattern with a time point that changes the magnitude of the current (SOC derating type update).

The adjustment coefficient may be a value calculated according to Equation 4 or Equation 5 below. That is, it may be a different value from the adjustment coefficient described in Equations 2 and 3 above.

adjustment coefficient=(100−β*(resistance increase rate (%)))/100    [Equation 4]

adjustment coefficient=1/(β*(1+resistance increase rate (%)/100))    [Equation 5]

In this case, the β value may be a value determined according to the type of the battery module 10. That is, the β value may be a value determined according to the chemical components constituting the battery cell, such as whether the battery module 10 is a lithium ion battery or a lithium ion polymer battery. This β value may have a value between 0.5 and 4.

FIG. 11 is a view showing another modification of the method of updating the current pattern for rapid charging according to the embodiment of FIG. 4. In FIG. 11, only a new current pattern obtained by multiplying a current pattern by an adjustment coefficient. In this example, charging is also performed in a capacity-limited manner, and the current is gradually reduced according to the SOC of the battery module 10.

In this example, the current pattern is updated by a hybrid update method in which both the current derating type update method described in FIG. 4 and the SOC derating type update described in FIG. 10 are applied. Therefore, the magnitude of the current is adjusted according to the adjustment coefficient described in FIG. 4, and the time point for adjusting the magnitude of the current is adjusted according to the adjustment coefficient described in FIG. 10.

FIG. 12 is experimental data for measuring a change in capacity of a battery module using the current pattern update method for rapid charging of FIGS. 4, 10, and 11. In the experiment of FIG. 12, the α value and the β value were set to 1. In addition, experiments were conducted using 4 cells with a resistance increase rate of 12%. If each of the four cells has no current pattern update, the current derating type update method, the SOC derating type update method, and the mixed update method were applied, and rapid charging was repeatedly performed.

As shown in FIG. 12, when rapid charging is continued with the initial current pattern (BOL), as the capacity of the battery module rapidly decreases as the number of rapid charges is repeated, it can be checked that sudden deterioration occurred. On the other hand, in the current derating type update method and the SOC derating type update method, it can be seen that the deterioration degree is similarly improved. In addition, in the case of the mixed update method, it can be seen that instead of taking the longest charging time, the degree of degradation is the lowest.

When the current pattern for rapid charging of the battery module 10 is continuously used without changing the previously stored current pattern, due to the change in the internal resistance of the battery module 10, it also affects the capacity of the battery module 10.

However, according to the various methods of updating the current pattern for rapid charging as described above, the current pattern also changes in consideration of the change in the internal resistance of the battery module 10. Therefore, even if the battery module 10 is rapidly charged, the capacity change of the battery module 10 can be minimized.

FIG. 13 is a view showing a method of updating a current pattern for rapid charging according to another embodiment of the present invention. In FIG. 13, only a new current pattern obtained by multiplying a current pattern by an adjustment coefficient.

FIG. 13 is a case in which charging is performed in a voltage-limited manner, and the current gradually decreases according to the voltage value of the battery module 10. As shown in FIG. 13, the current pattern is set to charge the current magnitude with i1 until the voltage value becomes v1, with i2 in the section from v1 to v2, with i3 in the section from v2 to v3, and with i4 from v3 to full charge. And the current pattern is changed as a dotted line by multiplying the adjustment coefficient by the time point at which the current pattern for rapid charging needs to be updated. The currents are changed to i1', i2', i3' and i4', respectively. Here, i1'=i1*(adjustment coefficient), i2'=i2*(adjustment coefficient), i3'=i3*(adjustment coefficient), and i4'=i4*(adjustment coefficient). That is, an existing current pattern is updated with a current pattern having a new magnitude generated by multiplying the magnitude of the current in the current pattern by an adjustment coefficient (current derating type update).

FIG. 14 is a view showing a modification of the method of updating the current pattern for rapid charging according to the embodiment of FIG. 13. In FIG. 14, only a new current pattern obtained by multiplying a current pattern by an adjustment coefficient. In this example, charging is also performed in a voltage-limited manner, and the current is gradually reduced according to the voltage value of the battery module 10.

However, in this example, the current pattern is changed as a dotted line by multiplying the voltage value set as the time point for changing the magnitude of the current by an adjustment coefficient. In other words, the time point at which the current changes from it to i2 changes from v1 to v1', the time point at which the current changes from i2 to i3 changes from v2 to v2', and the time point at which the current changes from i3 to i4 changes from v3 to v3'. Here, v1'=v1*(adjustment coefficient), v2'=v2*(adjustment coefficient), and v3'=v3*(adjustment coefficient). That is, an existing current pattern is updated to a new voltage value obtained by multiplying the voltage value set as a time point to change the magnitude of the current in the current pattern by an adjustment coefficient as a current pattern with a time point that changes the magnitude of the current (voltage derating type update).

Also in this example, the adjustment coefficient according to FIG. 13 and the adjustment coefficient according to FIG. 14 may be separately calculated as in FIGS. 4 and 10.

FIG. 15 is a view showing another modification of the method of updating the current pattern for rapid charging according to the embodiment of FIG. 13. In FIG. 15, only a new current pattern obtained by multiplying a current pattern by an adjustment coefficient. In this example, charging is also performed in a voltage-limited manner, and the current is gradually reduced according to the voltage value of the battery module 10.

In this example, the current pattern is updated by a hybrid update method in which both the current derating type update method described in FIG. 13 and the voltage derating type update described in FIG. 14 are applied. Therefore, the magnitude of the current is adjusted according to the adjustment coefficient described in FIG. 13, and the time point for adjusting the magnitude of the current is adjusted according to the adjustment coefficient described in FIG. 14.

Even in the case of performing rapid charging in the voltage-limited manner as described above, when the current pattern is updated by either the current derating type update method, the voltage derating type update method, or the mixed update method, rapid charging is performed so that it is possible to minimize the change in capacity of the battery module 10.

FIG. 16 is a block diagram showing detailed functions of a calculation unit according to another embodiment of the present invention. Here, the differences from FIG. 3 will be mainly described.

The update requirement determination unit 134 determines when to update the current pattern for rapid charging. In the present embodiment, the current pattern for rapid charging is applied with a voltage limiting method that performs charging until the battery module 10 reaches a preset voltage. In this case, the update requirement determination unit 134 determines that it is time to update the current pattern when the transition curve of the charge ending capacity, which is the capacity upon completion of charging of the rapid charging, satisfies a preset criterion. The preset criterion for the transition curve of the charge ending capacity may be that an inflection point is generated in the transition curve of the charge ending capacity.

When it is determined by the update requirement determination unit 134 that the current pattern needs to be updated, the current pattern for rapid charging is updated with the new current pattern calculated by the current pattern calculation unit 133. In this case, the updated current pattern may be stored in the storage unit 120.

A capacity calculation unit 136 calculates the charge ending capacity, which is the capacity of the battery module 10 upon completion of the rapid charging, whenever the rapid charging of the battery module 10 is performed. The capacity calculation unit 136 may use a sensor that monitors the voltage, current, and the like of the battery cell 11 and/or the battery module 10. In addition, the capacity calculation unit 136 may calculate the capacity of the battery module 10 by a method such as calculating the capacity of the battery module 10 from a value measured using a sensor.

FIG. 17 is test data showing a change in capacity of a battery module when updating a current pattern for rapid charging according to another embodiment of the present invention.

Referring to FIG. 17, the "Comparative Example 1" graph is a graph showing a change in the charge ending capacity of the battery module 10 when the update algorithm of the current pattern for rapid charging is not applied at all. It was checked that the charge ending capacity rapidly increased after about 20 times of rapid charging.

The 'Comparative Example 2' graph applies the update algorithm of the rapid charging current pattern, but the update time point is a graph applied when the inflection point is generated. Compared to Comparative Example 1, it was checked that the charge ending capacity did not change even after a considerable number of rapid charging repetitions. However, after about 60 times of rapid charging, it was checked that the charge ending capacity rapidly increased.

The 'Embodiment' graph is a graph in which the update algorithm of the current pattern for rapid charging is applied immediately after the inflection point occurs. As can be clearly seen in the graph, it was confirmed that despite the repeated rapid charging of 100 times or more, there was little increase in the charge ending capacity of the battery module 10.

When not updating the current pattern for rapid charging of the battery module 10 and also update timing is delayed even when updating, the capacity reduction of the battery module 10 cannot be avoided.

However, according to the method of determining the update timing of the current pattern for rapid charging according to the embodiment of the present invention as described above, it is possible to accurately and quickly identify the time point that needs to update the current pattern for rapid charging, so that it is possible to minimize the change in capacity of the battery module 10.

Alternatively, other methods may be used in addition to determining the time point for updating the current pattern for rapid charging based on the inflection point of the transition curve of the charge end voltage or the transition curve of the charge ending capacity as described above. For example, it may be set to update the current pattern when the increase rate of the resistance calculated above becomes a preset reference value or more.

FIG. 18 is a flowchart illustrating a method of determining a time point of stopping the use of a battery module according to an embodiment of the present invention.

Referring to FIG. 18, an algorithm for determining a time point of stopping the use of a battery module determines whether rapid charging is performed (S30). In this embodiment, it is assumed that the current pattern for rapid charging is already applied to the update algorithm according to the embodiment of the present invention. When it is determined that the rapid charging is performed, the charge end voltage or charge ending capacity is detected (S31). Then, it is determined whether the detected charge end voltage or charge ending capacity has changed more than a reference value (S32). Determining whether or not the reference value has fluctuated may include determining whether the voltage at the end of charge has exceeded the reference value. In addition, determining whether it has fluctuated more than the reference value may include determining whether the charge ending capacity is less than the reference value.

When the charge end voltage or the charge ending capacity fluctuates more than a reference value, it is determined that the use limit of the battery module 10 has been reached, and the use of the battery module 10 is stopped (S33). And it is possible to notify the upper-level controller 2 of the purpose that the use of the battery module 10 is stopped. On the other hand, if the charge end voltage or charge ending capacity has not changed more than the reference value, it is determined that the battery module 10 can be continuously used.

FIGS. 19 and 20 are graphs for explaining a time point of stopping the use of a battery module according to an embodiment of the present invention.

As shown in FIGS. 19 and 20, when the rapid charging is repeated, a case in which the charge end voltage or the charge ending capacity fluctuates rapidly occurs, and in this case, the battery module 10 cannot supply the required output. Therefore, a serious safety situation may occur in a vehicle in which the battery pack 1 is mounted. Therefore, when the charge end voltage or the charge end capacity fluctuates more than a reference value, the use of the battery module 10 is stopped.

Alternatively, the determination of the time point of stopping the use of the battery module 10 may use other methods. For example, when the number of times of detecting that an inflection point occurs in a transition curve of charge end voltage or charge end capacity detected earlier becomes a preset reference number, it may be set to stop the use of the battery module 10.

FIG. 21 is a hardware configuration diagram of a battery management system.

Referring to FIG. 21, the BMS 20 may include a controller (MCU) 210, a memory 220, an input/output interface 230, and a communication interface 240.

The MCU 210 performs processing of various operations and calculations in the BMS 20 and control of each component.

In the memory 220, an operating system program and a program for performing the functions of the BMS 20 are recorded. That is, computer programs provided with an algorithm for updating the current pattern for rapid charging according to embodiments of the present invention, and an algorithm for determining the update timing of the current pattern and the timing of the stopping the use of the battery module 10 may be stored in the memory 220. The memory 220 may include volatile memory and nonvolatile memory. For example, at least one of various storage media such as a semiconductor memory such as RAM, ROM, and flash memory, a magnetic disk, and an optical disk may be used as the memory 220. The memory 220 may be a memory built in the MCU 210 or an additional memory installed separately from the MCU 210.

The input/output interface 230 performs input/output of various input signals and output signals. For example, the MCU 210 included in the BMS 20 may receive signals from various sensors through the input/output interface 230.

The communication interface 240 is a component capable of communicating with the outside in a wired and/or wireless manner.

As the MCU 210 executes a program stored in the memory 220, it is possible to implement a module for performing the functions of the resistance calculation unit 110, the calculation unit 130, the resistance increase rate calculation unit 131, and the adjustment coefficient calculation unit 132, the current pattern calculation unit 133, the update requirement determination unit 134, and the capacity calculation unit 136. The memory 220 may function as the storage unit 120. The MCU 210 may operate together with the input/output interface 230 to perform functions as the resistance calculation unit 110 and the voltage measurement unit 135. In addition, the MCU 210 may operate with the communication interface 240 to perform a function as the communication unit 140.

In addition, the terms "include", "compose", or "have" as described above means that the corresponding component can be intrinsic, unless otherwise stated, so that it should be interpreted that other components may be further included, not excluded. All terms, including technical or scientific terms, can be interpreted as having the same meaning as generally understood by a person skilled in the art to which the present invention belongs, unless otherwise defined. Generally used terms, such as predefined terms, should be interpreted as being consistent with the contextual meaning of the related art, and are not to be interpreted in an ideal or excessively formal sense, unless explicitly defined in the present invention.

The above description is merely illustrative of the technical idea of the present invention, and those skilled in the art to which the present invention pertains will be able to make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed according to the following claims, and all technical ideas falling within the scope of the same shall be construed as falling within the scope of the present invention.

The invention claimed is:

1. An apparatus for updating a current pattern for rapid charging, the apparatus comprising:
   a resistance calculation unit configured to calculate an internal resistance of a battery module;
   a storage unit configured to store a current pattern for rapid charging of the battery module; and
   a calculation unit configured to update the current pattern according to a state of the internal resistance of the battery module, wherein the calculation unit:
calculates a resistance increase rate based on the internal resistance calculated by the resistance calculation unit,
calculates an adjustment coefficient based on the calculated resistance increase rate, and
updates the current pattern using the calculated adjustment coefficient and the current pattern for charging the battery module.

2. The apparatus of claim 1, wherein the calculation unit updates the current pattern with a value obtained by multiplying the current pattern by the adjustment coefficient.

3. The apparatus of claim 1, wherein the calculation unit decreases the adjustment coefficient as the resistance increase rate increases.

4. The apparatus of claim 1, wherein the rapid charging of the battery module is a capacity limited method performed until a preset charging capacity is reached.

5. The apparatus of claim 4, wherein the calculation unit updates the current pattern with a Previously Presented current pattern having a Previously Presented magnitude of current generated by multiplying a magnitude of current in the current pattern by the adjustment coefficient.

6. The apparatus of claim 4, wherein the calculation unit updates the current pattern with a Previously Presented current pattern in which a value of a Previously Presented state of charge (SOC) generated by multiplying a value of an SOC set as a time point for changing a magnitude of current in the current pattern by the adjustment coefficient.

7. The apparatus of claim 4, wherein the calculation unit further comprises a voltage measurement unit that measures a charge end voltage, which is a voltage upon completion of the rapid charging, every time the rapid charging of the battery module is performed, and
wherein when a transition curve of the charge end voltage satisfies a preset criterion, the calculation unit updates the current pattern.

8. The apparatus of claim 7, wherein the preset criteria are cases when occurrence of an inflection point is detected in the transition curve of the charge end voltage.

9. The apparatus of claim 1, wherein the rapid charging of the battery module is a voltage-limited method performed until a preset voltage is reached.

10. The apparatus of claim 9, wherein the calculation unit updates the current pattern with a Previously Presented current pattern having a Previously Presented magnitude of current generated by multiplying a magnitude of the current in the current pattern by the adjustment coefficient.

11. The apparatus of claim 9, wherein the calculation unit updates an existing current pattern with a current pattern in which a Previously Presented voltage value generated by multiplying a voltage value set as a time point for changing a magnitude of current in the current pattern by the adjustment coefficient.

12. The apparatus of claim 9, further comprising a capacity calculation unit for calculating a charge end capacity that is the capacity of the battery module upon completion of rapid charging for the battery module, and
wherein when a transition curve of the charge end capacity satisfies preset criteria, the calculation unit updates the current pattern.

13. The apparatus of claim 12, wherein the preset criteria are cases when occurrence of an inflection point is detected in the transition curve of the charge end capacity.

14. A method of updating a current pattern for rapid charging, the method comprising:
setting a current pattern for rapid charging of a battery module;
calculating an internal resistance of the battery module;
calculating a resistance increase rate of the battery module;
calculating an adjustment coefficient based on the resistance increase rate; and
updating the current pattern using the adjustment coefficient to generate an adjustment current pattern.

15. A computer program stored in a non-transitory computer-readable storage medium and allowing a computer to execute a method including:
calculating an internal resistance of the battery module;
calculating a resistance increase rate based on the calculated internal resistance;
calculating an adjustment coefficient based on the calculated resistance increase rate; and
updating the current pattern using the calculated adjustment coefficient and a preset current pattern for rapid charging of the battery module.

16. The computer program of claim 15, wherein the method further comprises detecting a charge end voltage that is the voltage upon completion of the rapid charging for the battery module or the charge end capacity that is the capacity upon completion of the rapid charging, and
wherein the computer updates the current pattern when it is detected that an inflection point occurs in a transition curve of the charge end voltage or the charge end capacity.

17. The computer program of claim 15, wherein the method further comprises updating a battery management system (BMS) to control the charging and discharging of the battery module based on the updated current pattern.

18. The apparatus of claim 1, further comprising a battery management system (BMS) configured to control the charging and discharging of the battery module based on the updated current pattern.

* * * * *